(12) United States Patent
Derrig

(10) Patent No.: US 8,927,107 B2
(45) Date of Patent: Jan. 6, 2015

(54) MULTI-COATED METALLIC PRODUCTS AND METHODS OF MAKING THE SAME

(71) Applicant: Frederick Goldman, Inc., New York, NY (US)

(72) Inventor: Andrew Derrig, Lynbrook, NY (US)

(73) Assignee: Frederick Goldman, Inc., New York, NY (US)

( * ) Notice: Subject to any disclaimer, the term of this patent is extended or adjusted under 35 U.S.C. 154(b) by 0 days.

(21) Appl. No.: 14/165,531

(22) Filed: Jan. 27, 2014

(65) Prior Publication Data

US 2014/0141278 A1    May 22, 2014

Related U.S. Application Data

(63) Continuation of application No. 13/486,081, filed on Jun. 1, 2012.

(60) Provisional application No. 61/493,249, filed on Jun. 3, 2011.

(51) Int. Cl.
*A44C 27/00*    (2006.01)

(52) U.S. Cl.
CPC ..................... *A44C 27/006* (2013.01)
USPC ........... 428/469; 63/3; 63/12; 63/15; 63/15.9; 63/20; 63/23; 63/34; 428/472; 428/697; 428/698; 428/699; 428/704

(58) Field of Classification Search
USPC ......... 63/3, 12, 15, 15.9, 20, 23, 34; 428/469, 428/472, 697, 698, 699, 704
See application file for complete search history.

(56) References Cited

U.S. PATENT DOCUMENTS

| | | | |
|---|---|---|---|
| 3,719,479 A | | 3/1973 | Flanagan |
| 3,958,070 A | * | 5/1976 | Schintlmeister et al. ..... 428/457 |
| 4,101,318 A | | 7/1978 | Rudy |
| 4,374,900 A | | 2/1983 | Hara et al. |
| 4,403,014 A | * | 9/1983 | Bergmann ........................ 63/12 |
| 4,505,746 A | | 3/1985 | Nakai et al. |
| 4,557,981 A | | 12/1985 | Bergmann |
| 4,636,252 A | | 1/1987 | Yoshimura et al. |
| 4,745,035 A | * | 5/1988 | Saurer et al. ................... 428/614 |
| 4,898,768 A | * | 2/1990 | Randhawa .................... 428/699 |
| 4,943,486 A | * | 7/1990 | Uchiyama ..................... 428/698 |

(Continued)

FOREIGN PATENT DOCUMENTS

| | | | |
|---|---|---|---|
| DE | 202006017385 | * | 1/2007 |
| EP | 1318204 | | 6/2003 |

(Continued)

OTHER PUBLICATIONS

International Search Report and Written Opinion dated Aug. 21, 2012 in related International Application No. PCT/US2012/040415 filed Jun. 1, 2012, 7 pages.

(Continued)

*Primary Examiner* — Archene Turner
(74) *Attorney, Agent, or Firm* — Dentons US LLP

(57) ABSTRACT

The present invention relates generally to a coated jewelry article or a coated component of a jewelry article, comprising a jewelry article or a component of a jewelry article, a first metallic coating, and a second metallic coating.

25 Claims, 5 Drawing Sheets

(56) References Cited

U.S. PATENT DOCUMENTS

| | | | |
|---|---|---|---|
| 5,021,208 A | 6/1991 | Ludwig et al. | |
| 5,776,408 A | 7/1998 | Ghosh et al. | |
| 5,853,826 A | 12/1998 | Starcke et al. | |
| 5,985,469 A * | 11/1999 | Kurakata et al. | 428/627 |
| 6,062,045 A | 5/2000 | West | |
| 6,319,460 B1 | 11/2001 | Fang | |
| 6,544,315 B2 | 4/2003 | Har-Shai | |
| 6,553,667 B1 | 4/2003 | West | |
| 6,641,640 B1 | 11/2003 | Hesse et al. | |
| 6,767,418 B1 | 7/2004 | Zhang et al. | |
| 6,780,527 B2 * | 8/2004 | Naoi et al. | 428/472 |
| 6,928,734 B1 | 8/2005 | West | |
| 6,990,736 B2 | 1/2006 | West | |
| 6,993,842 B2 | 2/2006 | West | |
| 7,032,314 B2 | 4/2006 | West | |
| 7,076,972 B2 | 7/2006 | West | |
| 7,261,956 B2 * | 8/2007 | Kawakami et al. | 428/704 |
| 7,761,996 B2 | 7/2010 | West | |
| 8,003,225 B2 * | 8/2011 | Miya et al. | 63/34 |
| 8,061,033 B2 | 11/2011 | West | |
| 8,168,012 B2 | 5/2012 | Steinemann | |
| 2003/0134577 A1 | 7/2003 | Coad | |
| 2005/0166401 A1 | 8/2005 | Robert | |
| 2005/0208325 A1 | 9/2005 | Kawakami et al. | |
| 2006/0051618 A1 | 3/2006 | Festeau et al. | |
| 2007/0056778 A1 | 3/2007 | Webb et al. | |
| 2008/0241551 A1 | 10/2008 | Zhang et al. | |
| 2009/0041612 A1 | 2/2009 | Fang et al. | |
| 2009/0308102 A1 | 12/2009 | Miller | |
| 2010/0047618 A1 | 2/2010 | Rostagno | |
| 2010/0261034 A1 | 10/2010 | Cardarelli | |
| 2010/0329920 A1 | 12/2010 | Rosenberg | |
| 2011/0218093 A1 | 9/2011 | Xia | |
| 2011/0296873 A1 | 12/2011 | Derrig | |
| 2012/0093675 A1 | 4/2012 | Miller | |

FOREIGN PATENT DOCUMENTS

| | | | |
|---|---|---|---|
| GB | 2162864 | * | 2/1986 |
| JP | 58-11783 | * | 1/1983 |
| JP | 08-013133 | * | 1/1996 |

OTHER PUBLICATIONS

International Search Report and Written Opinion dated Aug. 21, 2012 in related International Application No. PCT/US2012/040460 filed Jun. 1, 2012, 10 pages.

International Search Report and Written Opinion dated Aug. 27, 2012 in related International Application No. PCT/US2012/040356 filed Jun. 1, 2012, 14 pages.

EP1318204, English translation by Patent Translate published Jun. 11, 2003, downloaded from European Patent Office on May 30, 2013, no English language corresponding application is available, 6 pages.

* cited by examiner

|  |  |  | Cr/Steel 30/70 | Cr/Steel 60/40 | Cr/Steel 70/30 | Cr/Steel 75/25 | Cr/Steel 80/20 | Cr/Steel 90/10 |
|---|---|---|---|---|---|---|---|---|
| Carbon | C | 0.03% | 0.021% | 0.012% | 0.009% | 0.008% | 0.006% | 0.003% |
| Manganese | Mn | 2.00% | 1.400% | 0.800% | 0.600% | 0.500% | 0.400% | 0.200% |
| Silicon | Si | 1.00% | 0.700% | 0.400% | 0.300% | 0.250% | 0.200% | 0.100% |
| Phosphorus | P | 0.05% | 0.032% | 0.018% | 0.014% | 0.011% | 0.009% | 0.005% |
| Sulphur | S | 0.03% | 0.021% | 0.012% | 0.009% | 0.008% | 0.006% | 0.003% |
| Chromium | Cr | 17.00% | 11.900% | 6.800% | 5.100% | 4.250% | 3.400% | 1.700% |
| Molybdenum | Mo | 2.50% | 1.750% | 1.000% | 0.750% | 0.625% | 0.500% | 0.250% |
| Nickel | Ni | 12.00% | 8.400% | 4.800% | 3.600% | 3.000% | 2.400% | 1.200% |
| Iron | Fe | 65.00% | 45.500% | 26.000% | 19.500% | 16.250% | 13.000% | 6.500% |
| 316 Steel% | | | 70% | 40% | 30% | 25% | 20% | 10% |
| Pure Chrome % | | | 30% | 60% | 70% | 75% | 80% | 90% |
| Total | | | 100% | 100% | 100% | 100% | 100% | 100% |

FIG. 3

MULTI-COATED METALLIC PRODUCTS AND METHODS OF MAKING THE SAME

CROSS-REFERENCE TO RELATED APPLICATIONS

The present application is a Continuation of U.S. Nonprovisional application Ser. No. 13/486,081 filed 1 Jun. 2012; which claims the benefit of U.S. Provisional Application Ser. No. 61/493,249 filed 3 Jun. 2011; each of which are incorporated herein by reference in its entirety.

BACKGROUND OF THE INVENTION

The present application generally relates to metal or metallic articles such as jewelry that are coated or plated with metal or metallic coatings.

Plating is a process where a thin layer of metal is deposited on the surface of a substrate. Metals are plated for various reasons, including for decoration, to harden, to alter conductivity, to inhibit corrosion, to reduce friction, to improve paint adhesion, to improve solderability, to improve wearability, and for radiation shielding. Gemstones can also be plated to provide improved color characteristics. See, e.g., U.S. Pat. No. 5,853,826.

Processes used in plating include electroplating, physical vapor deposition (PVD) and chemical vapor deposition (CVD). In electroplating, an electrical current is used to reduce cations of a coating material from a solution to coat a conductive substrate with a thin layer of the material. In PVD, a vaporized form of the coating metal is condensed in a vacuum onto the substrate surface. Vaporization and deposition of the coating metal can be effected by a number of methods known in the art, including evaporative deposition, electron beam physical vapor deposition, sputter deposition, cathodic arc deposition, pulsed laser deposition, and plasma-spray deposition. CVD involves exposing the substrate to a volatile precursor of the coating metal, which reacts or decomposes on the substrate surface.

While electroplating is the simplest process of plating a metal, electroplating is difficult or impossible where the substrate is a refractory metal such as tungsten, molybdenum, niobium, tantalum or rhenium. In particular, tungsten and tungsten alloys such as tungsten carbide cannot be electroplated. Thus, a tungsten or tungsten alloy article such as an article of jewelry cannot be directly electroplated with, e.g., a layer of a precious metal such as gold, platinum or rhodium. This makes production of plated articles of a tungsten or tungsten alloy substrate difficult to produce. There is thus a need for new methods of making such articles. The present invention addresses that need.

SUMMARY

In some embodiments, the present invention relates to a method for producing a jewelry article or a coated component of a jewelry article, comprising: (a) providing a jewelry article or a coated component of a jewelry article; (b) subjecting the jewelry article or coated component of the jewelry article to a first layering process to obtain a first coated jewelry article or coated component of a jewelry article comprising a first coating; and (c) subjecting the first coated jewelry article or coated component of the jewelry article to a second layering process to obtain a second coated jewelry article or coated component of a jewelry article comprising a second coating. In further embodiments, the jewelry article or coated component of the jewelry article comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, brass, bronze, zinc, tin, German silver, niobium, molybdenum, rhenium, hafnium and combinations and alloys of each of the foregoing. In still further embodiments, the first substrate is tungsten carbide. In additional embodiments, the first coating comprises at least one of a metal, a material having metallic properties, a metal compound, a metallic compound, a metal alloy, a metal carbide and a metal boride.

In some embodiments, the jewelry article is a ring, ornamental ring, engagement ring, toe ring, watch, watchcase, watchband, bracelet, necklace, pendant, charm, armlet, brocade, pin, clip, hairclip, fob, ornamental piercing, earring, nose ring, dog tag, amulet, bangle bracelet, cuff bracelet, link bracelet, cuff link, key chain, money clip, cell phone charm, signet ring, class ring, friendship ring or purity ring or a component thereof. In further embodiments, the first coating comprises at least one of titanium diboride ($TiB_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, zinc, tin, German silver, niobium, molybdenum, hafnium, rhenium, chromium, a steel alloy, chromium carbide, zirconium carbide, tantalum carbide, cobalt chrome molybdenum and combinations and alloys of each of the foregoing. In further embodiments, the first coating is chromium. In still further embodiments, the first coating exhibits electrical conductivity. In additional embodiments, the first coating is deposited onto the substrate using vapor deposition, physical vapor deposition (PVD) or chemical vapor deposition (CVD).

In some embodiments, the second coating comprises at least one of titanium nitride (TiN), titanium(2) nitride ($Ti_2N$), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), tungsten nitride (WN), titanium diboride ($TiB_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and combinations and alloys of each of the foregoing. In further embodiments, the second coating alters the luster of the jewelry article. In still further embodiments, the luster is selected from color change, adamantine, dull, greasy, metallic, pearly, resinous, silky, submetallic, vitreous, waxy, asterism, aventurescence, chatoyancy, and schiller. In additional embodiments, the second coating exhibits electrical conductivity. In some embodiments, the second coating is deposited onto the substrate using electroplating, physical vapor deposition (PVD) or chemical vapor deposition (CVD). In further embodiments, the substrate is capable of being manipulated prior to the first layering process. In still further embodiments, the manipulation is performed using at least one of a CNC machine, a laser, photo lithography, a water jet, a lathe, a tumbler, a drill, a saw, a file, a tool, power tools and hand tools.

In some embodiments, the present invention relates to a coated jewelry item or a coated component of a jewelry item having a plurality of metal or metallic layers, comprising: a jewelry item or a component of a jewelry item; a first coating comprising a metal, a metal compound, a material having metallic properties or a compound having metallic properties, wherein the first coating is coupled to the jewelry item or the component of the jewelry item; and a second coating comprising a metal, a metal compound, a material having metallic properties or a compound having metallic properties, wherein the second coating is coupled to the first coating, and wherein the jewelry item or the component of the jewelry item, the first coating and the second coating form a surface that is resistant to deformation and wear. In further embodiments, the jewelry item or the component of the jewelry item, the first coating and the second coating form a surface that substantially retains the color of the second coating. In further embodiments, the jewelry item or the component of the jewelry item, comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, brass, bronze, zinc, tin, German silver, niobium, molybdenum, rhenium, hafnium and combinations and alloys of each of the foregoing. In still further embodiments, the jewelry item or the component of the jewelry item comprises tungsten carbide. In additional embodiments, the first coating comprises at least one of a metal, a material having metallic properties, a metal compound, a metallic compound, a metal alloy, a metal carbide and a metal boride. In some embodiments, the first coating exhibits electrical conductivity.

In some embodiments, the first coating is deposited onto the jewelry item or the component of the jewelry item, using vapor deposition, physical vapor deposition (PVD) or chemical vapor deposition (CVD). In further embodiments, the first coating comprises at least one of titanium diboride (TiB$_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, zinc, tin, German silver, niobium, molybdenum, hafnium, rhenium, chromium, a steel alloy, chromium carbide, zirconium carbide, tantalum carbide, cobalt chrome molybdenum and combinations and alloys of each of the foregoing. In still further embodiments, the second coating comprises at least one of titanium nitride (TiN), titanium(2) nitride (Ti$_2$N), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (AlTiN), aluminum-titanium-chromium nitride (AlTiCrN), tungsten nitride (WN), titanium diboride (TiB$_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, tungsten copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and combinations and alloys of each of the foregoing. In additional embodiments, the second coating alters the luster of the metallic substance. In some embodiments, the luster is selected from color change, adamantine, dull, greasy, metallic, pearly, resinous, silky, submetallic, vitreous, waxy, asterism, aventurescence, chatoyancy, and schiller. In further embodiments, the second coating exhibits electrical conductivity. In still further embodiments, the second coating is deposited onto the substrate using electroplating, physical vapor deposition (PVD) or chemical vapor deposition (CVD). In additional embodiments, the first coating is selected from the group consisting of a metal, a material having metallic properties, a metal compound, a metallic compound, a metal alloy, metal carbide and metal boride. In some embodiments, the second coating is selected from the group consisting of a metal, a material having metallic properties, a metal compound, a metallic compound, a metal alloy, metal carbide and metal boride. In further embodiments, the second coating comprises at least one of gold, silver, platinum, palladium, rhodium, ruthenium and an alloy of any of the foregoing. In still further embodiments, the second coating is a galvanic coating.

In some embodiments, the present invention further comprises washing the coated jewelry article or the coated component of the jewelry article. In further embodiments, the coated jewelry article, coated component of the jewelry article or coated jewelry item exhibits a non-gray color or luster. In other embodiments, the coated jewelry article, coated component of the jewelry article or coated jewelry item substantially retain the color of the second coating. In still further embodiments, the jewelry article, component of the jewelry article or jewelry item comprises at least one of tungsten carbide, chrome, chromium, cobalt chrome or cobalt chromium. In additional embodiments, the coated jewelry article, coated component of the jewelry article or coated jewelry item comprises at least one layer of tungsten carbide, chrome, chromium, cobalt chrome or cobalt chromium. In some embodiments, the coated jewelry article, coated component of the jewelry article or coated jewelry item comprises at least one layer of steel, 316 stainless steel, nickel, nitinol, zirconium, cobalt, chrome, chromium, titanium-zirconium (TiZi), titanium-niobium-zirconium (TiNiZi) and an alloy of any of the foregoing. In further embodiments, the present invention relates to a method for making a jewelry ring comprising a substrate, a first coating of a metal, a material having metallic properties, a metal compound, a metallic compound, a metal alloy, metal carbide and metal boride, and an external metal or metallic coating, the method comprising cutting, pressing, molding, casting, striking, extruding, sintering and/or shaping the substrate into a ring shape; depositing the first coating onto the substrate; and depositing the external metal or metallic coating onto the first coating.

A method for making a jewelry ring comprising a substrate, a first coating of a metal, a material having metallic properties, a metal compound, a metallic compound, a metal alloy and a metal carbide, and an external metallic coating is additionally provided. The method comprises cutting, pressing, molding, casting, striking, extruding, sintering and/or shaping the substrate into a ring shape; depositing the first coating onto the substrate; and depositing the external metallic coating onto the first coating.

BRIEF DESCRIPTION OF THE DRAWINGS

FIG. 3 shows one embodiment of a chrome-steel (chromium-steel) composition of the second coating by component percentage.

DETAILED DESCRIPTION

In a method for making a jewelry ring, according to the present disclosure, the cutting, pressing, molding, casting, striking, extruding, sintering and/or shaping of the substrate can utilize any process known in the art, for example using a vacuum arc furnace, plasma hearth melting, induction skull melting, free smithing, wire electric discharge machining (EDM), sink EDM, CNC lathe, and/or any polishing or engraving method known. Heat treatments may also be performed to impart desired characteristics to the ring.

In various embodiments, the first coating is deposited onto the substrate by physical vapor deposition or chemical vapor deposition. In additional embodiments, the external metallic coating is deposited onto the first coating using any known deposition technique, such as, for example, vapor deposition, PVD or CVD. Where a hard surface is desired, for example for an article that is subject to extensive wear, such as a portion of a picture frame, a paperweight, or a portion of a piece of furniture (e.g., an inlay) that may be abraded during use, this process provides a surface that is resistant to deformation and wear.

The present disclosure describes jewelry articles and coated components of jewelry articles as well as methods for producing the same. The articles and components produced in the context of the present disclosure advantageously comprise at least two coatings each comprising a metal, metal alloy, metalloid or compound exhibiting metallic or metalloid-like properties. In some embodiments, the first coating decreases the deformation and/or physical degradation of the jewelry article and/or coated component of a jewelry article. In some embodiments, the second coating advantageously increases the robustness, hardness and sustainability of the jewelry article and/or coated component of a jewelry article. In the context of the present invention, it is intended that the "hardness" of the jewelry article and/or coated component of a jewelry article may be determined using a standard measure for hardness, including but not limited to the Mohs scale of hardness. See, e.g. Gupta, *Chemical Metallurgy Principles and Practice*, Wiley-VCH, 2003.

Figure 5:
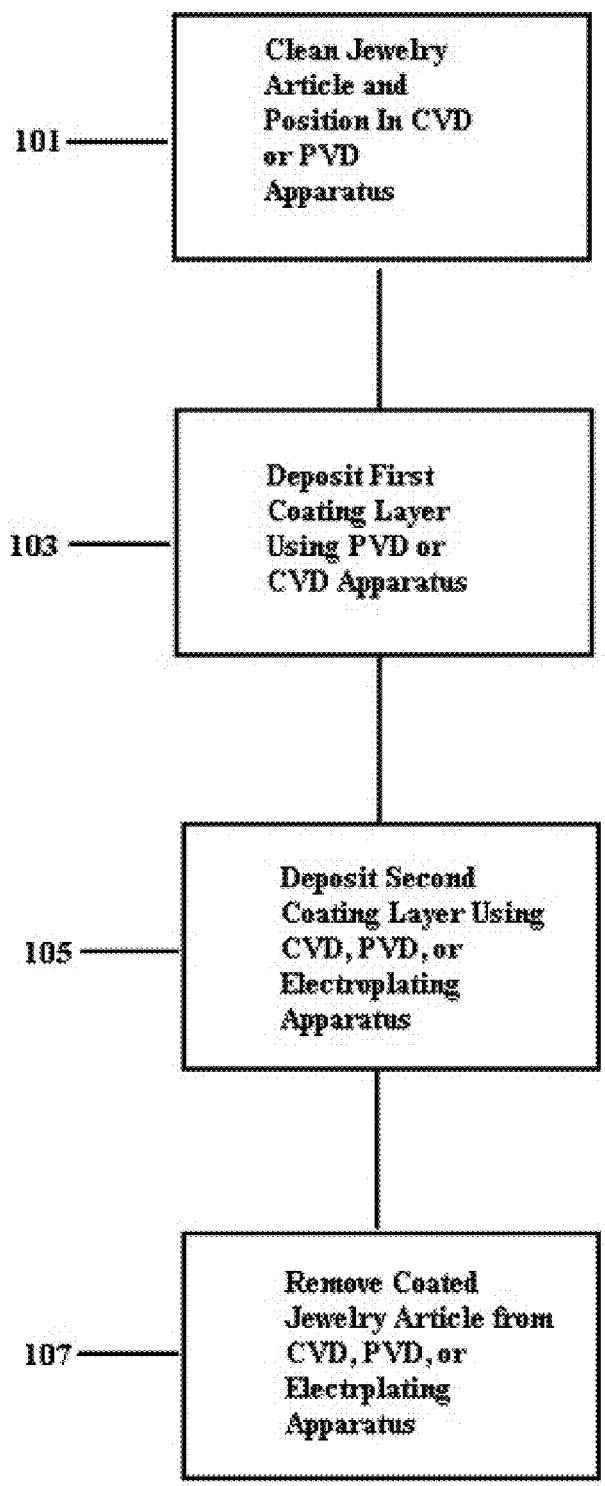
FIG. 5 shows a schematic for producing a coated jewelry article in accordance with an illustrative embodiment.

The process is shown in FIG. 5. In accordance with the present disclosure, as shown in step 101, the articles and components are first cleaned in a mild detergent solution with the aid of an ultrasonic cleaner to remove all grease and manufacturing residue. The articles and components are then placed in a rack special designed for optimal exposure in a PVD machine. Specifically, the hooks affixed to the rack are designed such that they exhibit minimal contact with the inside surface of the articles and components to avoid "shading," a defect that occurs when the PVD substrate remains in the same location and the hook used to hold the substrate in covers or occludes that area from proper coverage of the deposition layer. As shown in step 103, the articles and components are next run through a deposition process, such as a PVD or CVD process to deposit a first coating. In some embodiments, the methods of the present disclosure utilize a dual layer PVD process, which uses a multi-target PVD machine that allows for uninterrupted movement from one deposition layer to another without interruption of the vapor deposition cycle, which minimizes the risk of poor adhesion of the deposited film to the substrate. In some embodiments, the first coating is a pure chrome (chromium) deposit applied that measures approximately 0.1 microns in thickness under a vacuum in an inert atmosphere, such as argon gas. As shown in step 105, the first coated articles and components are next run through a second process, either a CVD, PVD or electroplating process, the selection may depend, for example, on the materials used, to deposit the second coating. In some embodiments, the second layer is applied during the second half of the PVD cycle as a cobalt-chrome alloy (cobalt-chromium) deposition layer made up of approximately 60% cobalt, approximately 35% chrome and approximately 5% other compounds, including but not limited to carbon, manganese, silicon, phosphorus, sulfur, molybdenum, nickel and alloys thereof. The second layer is deposited under an inert atmosphere at a thickness of approximately 0.2 microns. As shown in step 107, after deposition of the second coating the coated articles and components are removed from the PVD, CVD or electroplating equipment, and are then may be rinsed and packaged.

Figure 4:
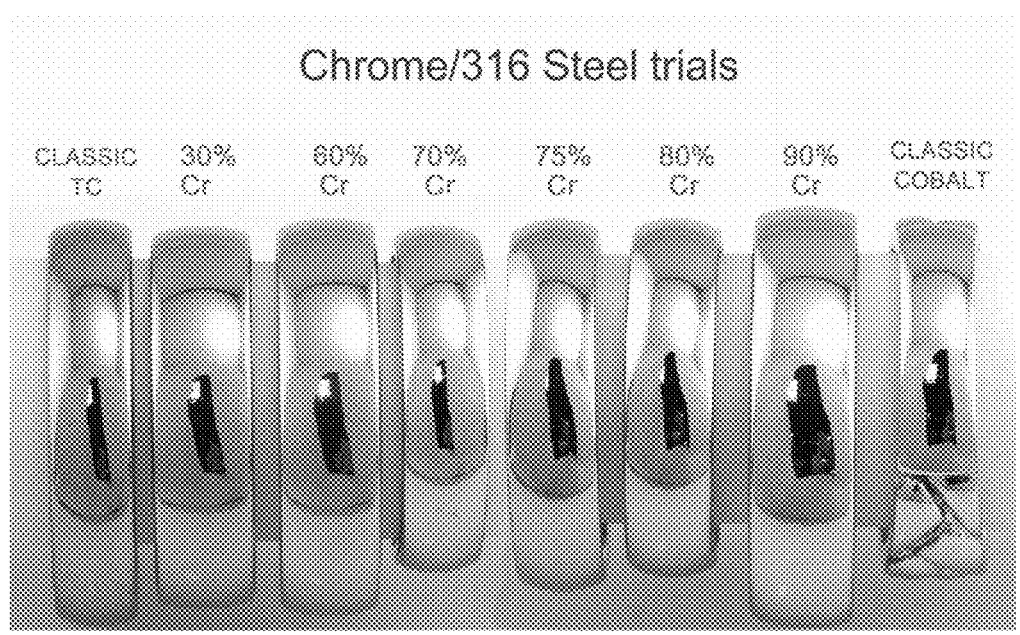
FIG. 4 shows a comparison between the appearance of varying percent compositions of chrome-steel (chromium-steel) alloys in the second coating of rings produced in accordance with the present disclosure, as well as rings essentially comprising tungsten-carbide alloy ("classic TC") or cobalt chrome alloy ("classic cobalt").

The articles and components produced in accordance with the present disclosure may comprise varying percentages of metals, materials having metallic properties, metal and/or metallic compounds, metal alloys and metal carbides. In some embodiments, as shown in FIG. 3 and FIG. 4, the articles and components may comprise chrome:stainless steel (chromium:stainless steel) ratios including but not limited to 30:70, 60:40, 70:30, 75:25, 80:20 and 90:10. In further embodiments, additional compounds, including but not limited to carbon, manganese, silicon, phosphorus, sulfur, molybdenum, nickel and alloys thereof, may comprise the articles and components produced in accordance with the present disclosure. For example, a jewelry article comprising a chrome:stainless steel ratio of 90:10 may, in some embodiments, comprise about 0.003% carbon, about 0.2% manganese, about 0.1% silicon, about 0.005% phosphorus, about 0.003% sulfur, about 1.7% chrome (chromium), about 0.25% molybdenum, about 1.2% nickel and about 6.5% iron.

Described herein are articles having two or more metallic coatings. In various embodiments, the first metallic coating provides a substrate for depositing or electroplating the second, external metallic coating.

Particularly suitable external metallic coatings for these articles are any material that can be electroplated or vapor deposited onto the first coating. In some embodiments, the external metallic coating comprises a material that imparts an attractive coloration to the article, for example platinum, rhodium, palladium, ruthenium, gold, a gold alloy, silver, a silver alloy, zirconium, tungsten nitride, tungsten carbide, or chrome or one of the materials described above. In particular embodiments, the external metallic coating modifies the luster of the article.

For example, one specific embodiment of a ring comprises a tungsten carbide substrate, a chromium first coating, and a rhodium external metallic coating.

The external metallic coating can be any coating appropriate for the metallic article. Where a hard surface is desired, for example for an article that is subject to extensive wear, such as a belt buckle, a picture frame, a paperweight, or a portion of a piece of furniture (e.g., an inlay) that may be abraded during use, the external metallic coating can be a hard material such as TiAlN, TiN, or TiB$_2$. In other embodiments, the external metallic coating comprises a material that enhances the luster and/or imparts an attractive coloration to the article, including but not limited to titanium nitride (TiN), titanium(2) nitride (Ti$_2$N), titanium carbo-nitride (TiCN), titanium-aluminum nitride (TiAlN), titanium-aluminum carbo-nitride (TiAlCN), chromium nitride (CrN), zirconium nitride (ZrN), chromium-titanium nitride (CrTiN), aluminum-titanium nitride (Al-TiN), aluminum-titanium-chromium nitride (AlTiCrN), tungsten nitride (WN), titanium diboride (TiB$_2$), tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, zinc, tin, German silver, niobium, molybdenum, hafnium, rhenium, chromium, a steel alloy, gold nitride, silver nitride, aluminum nitride, vanadium nitride, tantalum nitride, chromium carbide, zirconium carbide, tantalum carbide, cobalt chrome molybdenum and combinations and allows of each of the foregoing.

Figure 1:
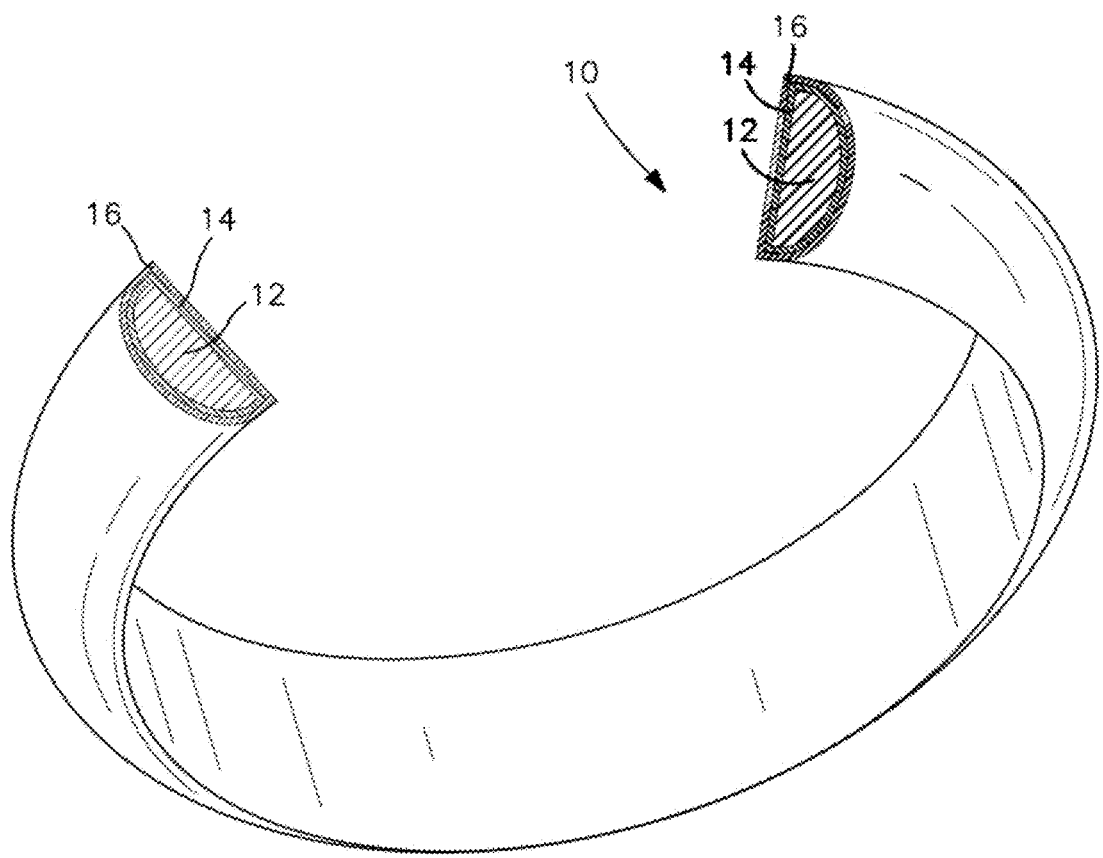
FIG. 1 shows a ring in accordance with an illustrative embodiment with a transverse cross-sectional cutout.
Figure 2:
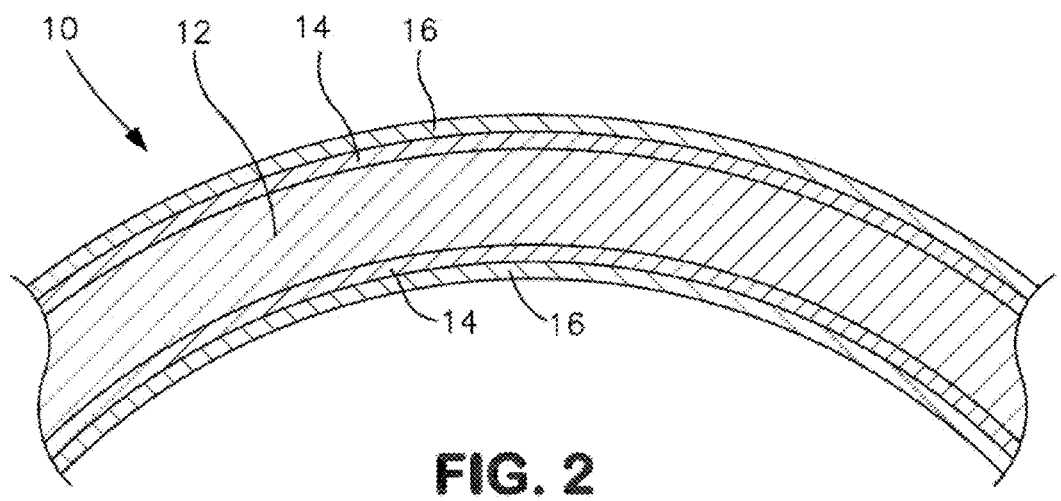
FIG. 2 shows a longitudinal cross-section of a ring in accordance with an illustrative embodiment.

FIGS. 1 and 2 provide a transverse cutout (FIG. 1) and a longitudinal cross-section (FIG. 2) of a finger ring 10 in accordance with some embodiments. In these embodiments, the substrate 12 is coated with a first coating 14 and an external metallic coating 16. In the figures, the thicknesses of the first coating 14 and the external metallic coating 16 are not necessarily drawn to scale.

Definitions

In the description herein, a number of terms are used. In order to provide a clear and consistent understanding of the specification and claims, the following definitions are provided:

As used herein, the singular forms "a", "an" and "the" are intended to include the plural forms as well, unless the context clearly indicates otherwise. Additionally, the use of "or" is intended to include "and/or", unless the context clearly indicates otherwise.

Electroplating: Refers to the process of moving metal ions in solution via an electrical or conductive field to coat an object. This process is used for the deposition of a material, such as a metal or metal alloy, for imparting a desirable property onto the object, including but not limited to resistance to scratching, corrosivity, chipping and dulling.

Jewelry: As used herein, "jewelry" refers to personal adornments worn for ornament or utility. Jewelry includes but is in no way limited to rings, ornamental rings, engagement rings, toe rings, watches, watchcases, bracelets, necklaces, chains, pendants, charms, armlets, brocades, pins, clips, hair-clips, carved beads, fobs, ornamental piercings, earrings, nose rings, body jewelry, dog tags, amulets, bangle bracelets, cuff bracelets, link bracelets, cuff links, tie clips, tie pins, tie tacks, key chains, money clips, cell phone charms, cutlerys, writing utensils, pens, charms, signet rings, class rings, friendship rings or purity rings.

Layering: As used herein, "layering" refers to a process wherein a composition, advantageously a metallic composition, is applied to a substrate optionally comprising zero, one, or more layered composition(s). In some embodiments, layering is performed using a machine or instrument capable of performing a vapor deposition or electroplating process.

Luster: As used herein, "luster" refers to the way light interacts with the surface and visual appearance of a substance. In some embodiments, the substance is a jewelry article. In further embodiments, the substance is a metallic substance that is optionally capable of being manipulated.

Manipulable: As used herein, a substance that is "manipulable" is one capable of being patterned, surface modulated, etched, carved, faceted, cut, pressed, molded, cast, stricken, extruded, inlayed, shaped, polished, grinded, scraped, rubbed, sanded, buffed and/or filed. In preferred embodiments, the substance is a substrate for use in the present disclosure.

Metal Alloy: As used herein, a "metal alloy" is a mixture of two or more metals or of substances with metallic properties. In some embodiments, metal alloys for use in the present disclosure comprise at least one transition metal including but in no way limited to tungsten, cobalt, tungsten, titanium, zirconium, tantalum, aluminum, rhodium, gold, silver, platinum, palladium, iridium, iron, stainless steel, nickel, niobium, vanadium, ruthenium, copper, zinc, tin, molybdenum, hafnium and rhenium. In certain embodiments, the metal alloy is selected from a gold alloy, silver alloy, platinum alloy, palladium alloy and iron alloy. In further embodiments, a stainless steel alloy is selected from types 18-8, 304 and 316.

Metal Carbide: A "metal carbide" is a compound comprising at least one transition metal or substance with metallic properties and carbon or carbon containing chemical group. In certain embodiments, metal carbides for use in the present disclosure include but are in no way limited to tungsten carbide, tungsten-copper carbide, tungsten-silver-copper carbide, titanium carbide, zirconium carbide, niobium carbide, hafnium carbide, vanadium carbide, tantalum carbide, chromium carbide, aluminum carbide and molybdenum carbide.

Metal Nitride: A "metal nitride" is a compound comprising at least one transition metal or substance with metallic properties and nitrogen or nitrogen containing chemical group. In some embodiments, metal nitrides for use in the present disclosure include but are in no way limited to titanium nitride, chromium nitride, zirconium nitride, tungsten nitride, gold nitride, silver nitride, aluminum nitride, vanadium nitride, tantalum nitride, aluminum-titanium-nitride, titanium-aluminum-nitride and titanium-carbon-nitride.

Metal Salt: A "metal salt" is a compound comprising at least one cationic, transition metal or cation with metallic properties and an anion. In some embodiments, metal salts for use in the present disclosure comprise at least one transition metal including but in no way limited to tungsten, cobalt, titanium, zirconium, tantalum, aluminum, rhodium, gold, silver, platinum, palladium, iridium, iron, stainless steel, cobalt, chromium, aluminum, vanadium, ruthenium, copper, zinc, tin, nickel, niobium, molybdenum, rhenium and hafnium.

Metal Sulfide: A "metal sulfide" is a compound comprising at least one transition metal or substance with metallic properties and sulfur or sulfur containing chemical group.

Polishing: As used herein, "polishing" refers to the process of smoothing and/or increasing the luster of a surface by the application of physical or chemical action or agent to a substance.

Vapor Deposition: Refers to a general process for the deposition of compounds onto a designated substrate. In preferred embodiments, the use of vapor deposition in the context of the present disclosure refers to chemical vapor deposition (CVD), physical vapor deposition (PVD), plasma enhanced chemical vapor deposition (PECVD), diamond CVD coating, ionized physical vapor deposition (IPVD), sputtering and thermal evaporation. In certain embodiments, vapor deposition is optionally used to add a first and/or a second layer to a substrate used to produce a jewelry article. In preferred embodiments, the first and/or second layer comprises a metal coating comprising one or more of tungsten, cobalt, tungsten, titanium, zirconium, tantalum, aluminum, rhodium, gold, silver, platinum, palladium, iridium, iron, stainless steel, nickel, niobium, vanadium, ruthenium, copper, zinc, tin, hafnium, molybdenum and rhenium. In certain embodiments, the metal alloy is selected from a gold alloy, silver alloy, platinum alloy, palladium alloy and iron alloy. In further embodiments, a stainless steel alloy is selected from types 18-8, 304 and 316.

Other embodiments within the scope of the claims herein will be apparent to one skilled in the art from consideration of the specification or practice of the invention as disclosed herein. It is intended that the specification be considered exemplary only, with the scope and spirit of the invention being indicated by the claims.

In view of the above, it will be seen that the several advantages of the invention are achieved and other advantages attained.

As various changes could be made in the above methods and compositions without departing from the scope of the invention, it is intended that all matter contained in the above description and shown in the accompanying drawings shall be interpreted as illustrative and not in a limiting sense.

All references cited in this specification are hereby incorporated by reference. The discussion of the references herein is intended merely to summarize the assertions made by the authors and no admission is made that any reference constitutes prior art. Applicants reserve the right to challenge the accuracy and pertinence of the cited references.

References

The following references are incorporated herein by reference in their entireties: U.S. Pat. Nos. 5,021,208; 6,062,045; 6,928,734.

The following references are also incorporated by reference herein in their entirely: U.S. Pat. No. 6,544,315, title "Sintered Jewelry and Decorative Articles"; U.S. Pat. No. 6,553,667, titled "Apparatus and Method for Manufacturing Composite Articles Including Wear Resistant Jewelry and Medical and Industrial Devices and Composites Thereof"; U.S. Pat. No. 6,990,736, titled "Methods for Preparing Jewelry Articles Comprising Sintered Tungsten Carbide"; U.S. Pat. No. 6,993,842, titled "Methods and Jewelry Articles Comprising Sintered Tungsten Carbide"; U.S. Pat. No. 7,032,314, titled "Methods of Making Tungsten Carbide-Based Annular Jewelry Rings"; U.S. Pat. No. 7,076,972, titled "Tungsten Carbide-Based Annular Jewelry Article"; U.S. application Ser. No. 12/141,791, titled "Tungsten Ring Composition"; U.S. Pat. No. 7,761,996, titled "Methods of Making Tungsten Carbide-Based Annular Jewelry Rings"; U.S. Pat. No. 8,061,033, titled "Methods of Making Tungsten Carbide-Based Annular Jewelry Rings"; U.S. Pat. App. Ser. No. 61/492,197, filed Jun. 1, 2011; U.S. Pat. App. Ser. No. 61/493,283, filed Jun. 3, 2011; U.S. patent application Ser. No. 13/152,226, filed Jun. 2, 2011, titled "Multi-Coated Metallic Articles and Methods of Making Same"; Dobkin et al., "Principles of Chemical Vapor Deposition," Springer, New York (2003); and Mahan, "Physical Vapor Deposition of Thin Films," Wiley-Interscience, New York (2000).

What is claimed is:

1. A two layer coated jewelry item or a two layer coated component of a jewelry item, consisting of:
   a substrate;
   a first coating comprising a metal, a metal compound, a material having metallic properties, a metallic compound, a metal alloy, or a compound having metallic properties, wherein the first coating is coupled to the substrate; and
   a second coating deposited over the first coating and selected from at least one of the items from at least one of the following groups:
   (a) zirconium nitride (ZrN), chromium-titanium nitride (CrTiN), aluminum-titanium nitride (AlTiN), aluminum-titanium-chromium nitride (AlTiCrN), tungsten nitride (WN), tungsten carbide, tungsten, zirconium, cobalt chrome, cobalt chromium, nitinol, aluminum, aluminum carbide, vanadium, copper, brass, bronze, tungsten copper, zinc, tin, German silver, niobium, molybdenum, hafnium, rhenium, chromium, a steel alloy, silver nitride, aluminum nitride, vanadium nitride, tantalum nitride, chromium carbide, zirconium carbide, tantalum carbide, and cobalt chrome molybdenum, or
   (b) cobalt, tantalum, iron and nickel, but excluding gold.

2. The jewelry item or component of the jewelry item of claim 1, further comprising a surface that substantially retains a color of the second coating.

3. The jewelry item or component of the jewelry item of claim 1, wherein the substrate comprises at least one of tungsten carbide, cobalt, tungsten, titanium, titanium carbide, zirconium, tantalum, rhodium, gold, silver, platinum, palladium, iridium, iron, stainless steel, 316 stainless steel, cobalt chrome, cobalt chromium, nickel, nitinol, aluminum, aluminum carbide, vanadium, ruthenium, copper, tungsten copper, brass, bronze, zinc, tin, German silver, niobium, molybdenum, rhenium, hafnium and combinations and alloys of each of the foregoing.

4. The jewelry item or component of the jewelry item of claim 1, wherein the substrate comprises tungsten carbide.

5. The jewelry item or component of the jewelry item of claim 1, wherein the first coating comprises a metal carbide.

6. The jewelry item or component of the jewelry item of claim 1, wherein the first coating exhibits electrical conductivity.

7. The jewelry item or component of the jewelry item of claim 1, wherein the first coating is deposited onto the substrate using physical vapor deposition (PVD) or chemical vapor deposition (CVD).

8. The jewelry item or component of the jewelry item of claim 1, wherein the first coating comprises at least one of tungsten carbide, cobalt, tungsten, titanium, titanium carbide, zirconium, tantalum, rhodium, gold, silver, platinum, palladium, iridium, iron, stainless steel, cobalt chrome, cobalt chromium, nickel, nitinol, aluminum, aluminum carbide, vanadium, ruthenium, copper, brass, bronze, zinc, tin, German silver, niobium, molybdenum, hafnium, rhenium, chromium, a steel alloy, chromium carbide, zirconium carbide, tantalum carbide, cobalt chrome molybdenum and combinations and alloys of each of the foregoing.

9. A two layer coated jewelry item or a two layer coated component of the jewelry item, consisting of:
   a substrate;
   a first coating selected from at least one of the following:
   tungsten carbide, cobalt, tungsten, titanium, zirconium, tantalum, iron, cobalt chrome, cobalt chromium, nitinol, aluminum, aluminum carbide, vanadium, ruthenium, brass, bronze, zinc, German silver, niobium, molybdenum, hafnium, rhenium, chromium carbide, cobalt chrome molybdenum, stainless steel, 18-8 stainless steel, 304 stainless steel, 316 stainless steel; and
   a second coating comprising a metal, a metal compound, a material having metallic properties or a compound having metallic properties, wherein the second coating is coupled to the first coating such that the first coating is interposed between the substrate and the second coating.

10. The jewelry item or component of the jewelry item of claim 1, wherein the second coating alters a luster of the two layer coated jewelry item or the two layer coated component of a jewelry item.

11. The jewelry item or component of the jewelry item of claim 10, wherein the luster is selected from color change, adamantine, dull, greasy, metallic, pearly, resinous, silky, submetallic, vitreous, waxy, asterism, aventurescence, chatoyancy, and schiller.

12. The jewelry item or component of the jewelry item of claim 1, wherein the second coating exhibits electrical conductivity.

13. The jewelry item or component of the jewelry item of claim 1, wherein the second coating is deposited over the first coating using electroplating, physical vapor deposition (PVD) or chemical vapor deposition (CVD).

14. The jewelry item or component of the jewelry item of claim 1, wherein the first coating is selected from a group consisting of a metal, a material having metallic properties, a metal compound, a metallic compound, and a metal alloy.

15. The jewelry item or component of the jewelry item of claim 9 wherein the substrate comprises tungsten carbide.

16. The jewelry item or component of the jewelry item of claim 9, wherein the second coating comprises a cobalt-chrome or a cobalt-chrome alloy made of approximately 60% cobalt and 35% chrome.

17. The jewelry item or component of the jewelry item of claim 9, wherein the first-coating is deposited over the substrate using physical vapor deposition (PVD) or chemical vapor deposition (CVD).

18. The jewelry item or component of the jewelry item of claim 9, wherein the second coating does not include gold.

19. The jewelry item or component of the jewelry item of claim 1, wherein the jewelry item or component of the jewelry item exhibits a non-gray color or luster.

20. The jewelry item or component of the jewelry item of claim 1, wherein the second coating is applied at a thickness of approximately 0.2 microns.

21. The jewelry item or component of the jewelry item of claim 1, wherein the first coating is pure chrome applied at a thickness of approximately 0.1 microns.

22. The jewelry item or component of the jewelry item of claim 1, wherein the jewelry item or component of the jewelry item comprises at least one layer of steel, 316 stainless steel, nickel, nitinol, zirconium, cobalt, chrome, chromium, titanium-zirconium (TiZi), titanium-niobium-zirconium (TiNiZi) and an alloy of any of the foregoing.

23. The jewelry item or component of the jewelry item of claim 1, wherein the jewelry item or the component of the jewelry item is a ring, an ornamental ring, an engagement ring, a toe ring, a watch, a watchcase, a watchband, a bracelet, a necklace, a pendant, a charm, an armlet, a brocade, a pin, a clip, a hairclip, a fob, an ornamental piercing, an earring, a nose ring, a dog tag, an amulet, a bangle bracelet, a cuff bracelet, a link bracelet, a cuff link, a key chain, a money clip, a cell phone charm, a signet ring, a class ring, a friendship ring or a purity ring, or a component thereof.

24. A two layer coated jewelry item or a two layer coated component of a jewelry item, consisting of:
    a substrate comprising tungsten carbide;
    a first coating comprising a metal, a metal compound, a material having metallic properties, a metallic compound, a metal alloy, or a compound having metallic properties, wherein the first coating is deposited over the substrate; and
    a second coating deposited over the first coating and selected from at least one of the items from at least one of the following groups:
    (a) zirconium nitride (ZrN), chromium-titanium nitride (CrTiN), aluminum-titanium nitride (AITiN), aluminum-titanium-chromium nitride (AITiCrN), tungsten nitride (WN), tungsten carbide, tungsten, zirconium, cobalt chrome, cobalt chromium, nitinol, aluminum, aluminum carbide, vanadium, copper, brass, bronze, tungsten copper, zinc, tin, German silver, niobium, molybdenum, hafnium, rhenium, chromium, a steel alloy, silver nitride, aluminum nitride, vanadium nitride, tantalum nitride, chromium carbide, zirconium carbide, tantalum carbide, and cobalt chrome molybdenum, or
    (b) cobalt, tantalum, iron and nickel, but excluding gold.

25. A two layer coated jewelry item or a two layer coated component of a jewelry item, consisting of:
    a substrate comprising tungsten carbide;
    a first coating selected from at least one of the following:
    tungsten carbide, cobalt, tungsten, titanium, zirconium, tantalum, iron, cobalt chrome, cobalt chromium, nitinol, aluminum, aluminum carbide, vanadium, ruthenium, brass, bronze, zinc, German silver, niobium, molybdenum, hafnium, rhenium, chromium carbide, cobalt chrome molybdenum, stainless steel, 18-8 stainless steel, 304 stainless steel, 316 stainless steel; and
    a second coating comprising a metal, a metal compound, a material having metallic properties or a compound having metallic properties, wherein the second coating is coupled to the first coating such that the first coating is interposed between the substrate and the second coating.

\* \* \* \* \*